US012641709B2

(12) United States Patent
Kim et al.

(10) Patent No.: US 12,641,709 B2
(45) Date of Patent: May 26, 2026

(54) ELECTROMAGNETIC WAVE SHIELDING SHEET, FLEXIBLE PRINTED CIRCUIT BOARD ATTACHED WITH ELECTROMAGNETIC WAVE SHIELDING SHEET, AND MANUFACTURING METHOD THEREOF

(71) Applicant: WISOL CO., LTD., Osan-si (KR)

(72) Inventors: Jung Min Kim, Osan-si (KR); Sang Sub Roh, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 394 days.

(21) Appl. No.: 18/088,927

(22) Filed: Dec. 27, 2022

(65) Prior Publication Data

US 2024/0164009 A1 May 16, 2024

(30) Foreign Application Priority Data

Nov. 16, 2022 (KR) ........................ 10-2022-0153348

(51) Int. Cl.
H05K 1/02 (2006.01)
B32B 5/02 (2006.01)
(Continued)

(52) U.S. Cl.
CPC ........... H05K 1/0216 (2013.01); B32B 5/022 (2013.01); H05K 1/0277 (2013.01); H05K 3/103 (2013.01);
(Continued)

(58) Field of Classification Search
None
See application file for complete search history.

(56) References Cited

U.S. PATENT DOCUMENTS 4,439,768 A * 3/1984 Ebneth ................. H05K 9/0084
427/404
2012/0111627 A1 * 5/2012 Kato ........................ D04H 3/14
174/388
(Continued)

FOREIGN PATENT DOCUMENTS

KR 10-2015-0072636 6/2015
KR 10-2020-0026065 3/2020
(Continued)

OTHER PUBLICATIONS

Park—WO 2017-039032 A1—MT-EM wave shielding sheet—2017 (Year: 2017).*
(Continued)

*Primary Examiner* — John Vincent Lawler

(57) ABSTRACT

Provided is an electromagnetic wave shielding sheet, a flexible printed circuit board attached with the electromagnetic wave shielding sheet, and a manufacturing method thereof. The flexible printed circuit board attached with the electromagnetic wave shielding sheet comprises: an electromagnetic wave shielding sheet including a nonwoven fabric having a plated surface and including an adhesive layer adsorbed therein without containing conductive particles, and a nonwoven fabric layer including a first insulating layer formed on the nonwoven fabric; and a flexible printed circuit board attached with the electromagnetic wave shielding sheet, wherein the flexible printed circuit board includes: a base film having a wiring pattern and a ground pattern formed on one side; and a second insulating layer covering the wiring pattern and exposing the ground pattern, and the nonwoven fabric layer having the adhesive layer adsorbed therein is in direct contact with the ground pattern.

2 Claims, 11 Drawing Sheets

10

140
180

160
152
151
200
150
120
100
130
170

110

(51) Int. Cl.
    *H05K 3/10*          (2006.01)
    *H05K 3/22*          (2006.01)
    *H05K 3/28*          (2006.01)

(52) U.S. Cl.
    CPC ................. *H05K 3/22* (2013.01); *H05K 3/28*
          (2013.01); *B32B 2255/02* (2013.01); *B32B*
          *2255/205* (2013.01); *B32B 2307/212*
          (2013.01); *B32B 2457/08* (2013.01); *H05K*
          *2201/0715* (2013.01)

(56) References Cited

U.S. PATENT DOCUMENTS

2016/0319471 A1 * 11/2016 Lee ........................... B32B 7/06
2020/0315072 A1 * 10/2020 Howland ................ B32B 15/20

FOREIGN PATENT DOCUMENTS

KR     10-2020-0101704     8/2020
WO    WO-2017039032 A1 *  3/2017  ............. B32B 15/08

OTHER PUBLICATIONS

Office Action for Korea Patent Application No. 10-2022-0153348, Date of Mailing: Feb. 23, 2023.

\* cited by examiner

【FIG. 1】
1
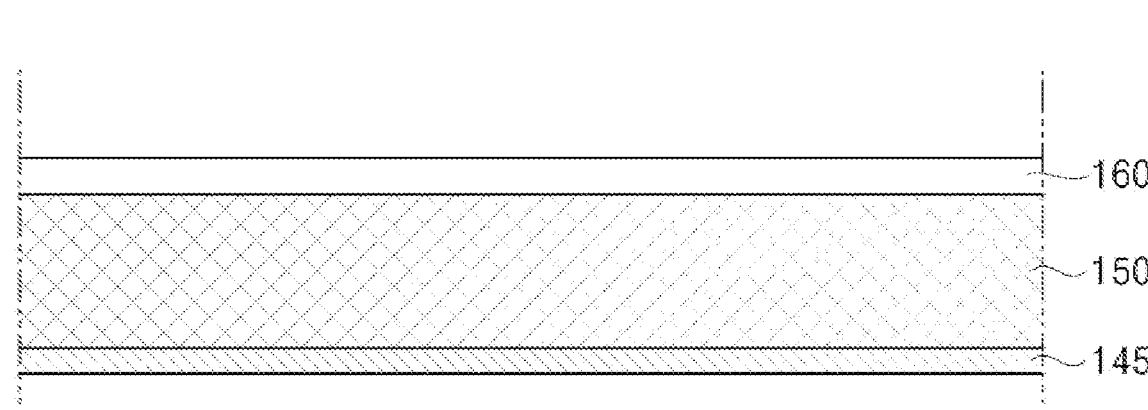

【FIG. 2】
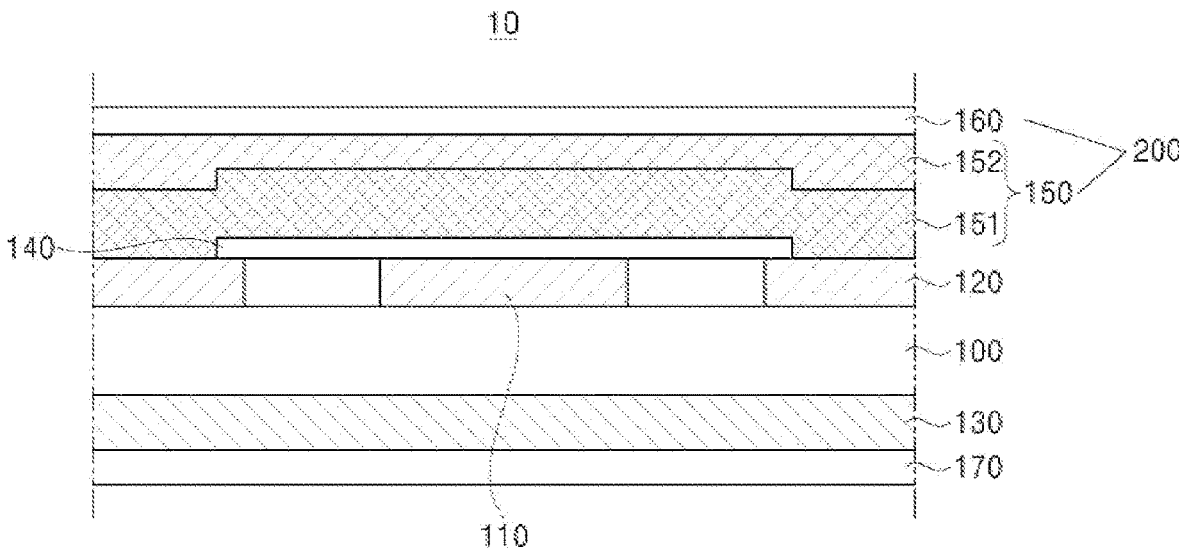

【FIG. 3】
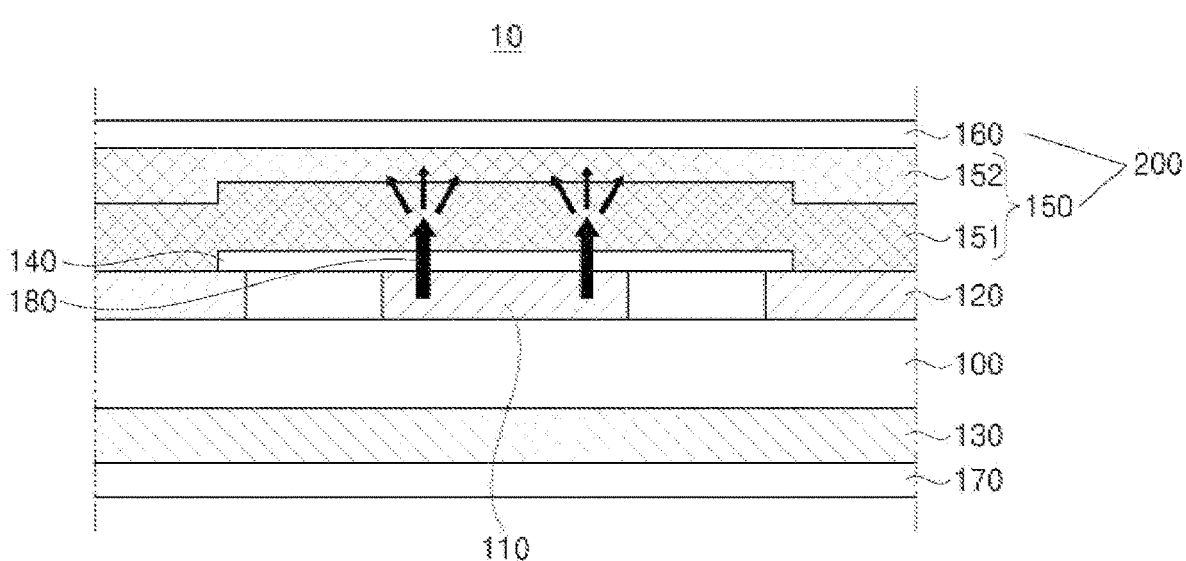

【FIG. 4】
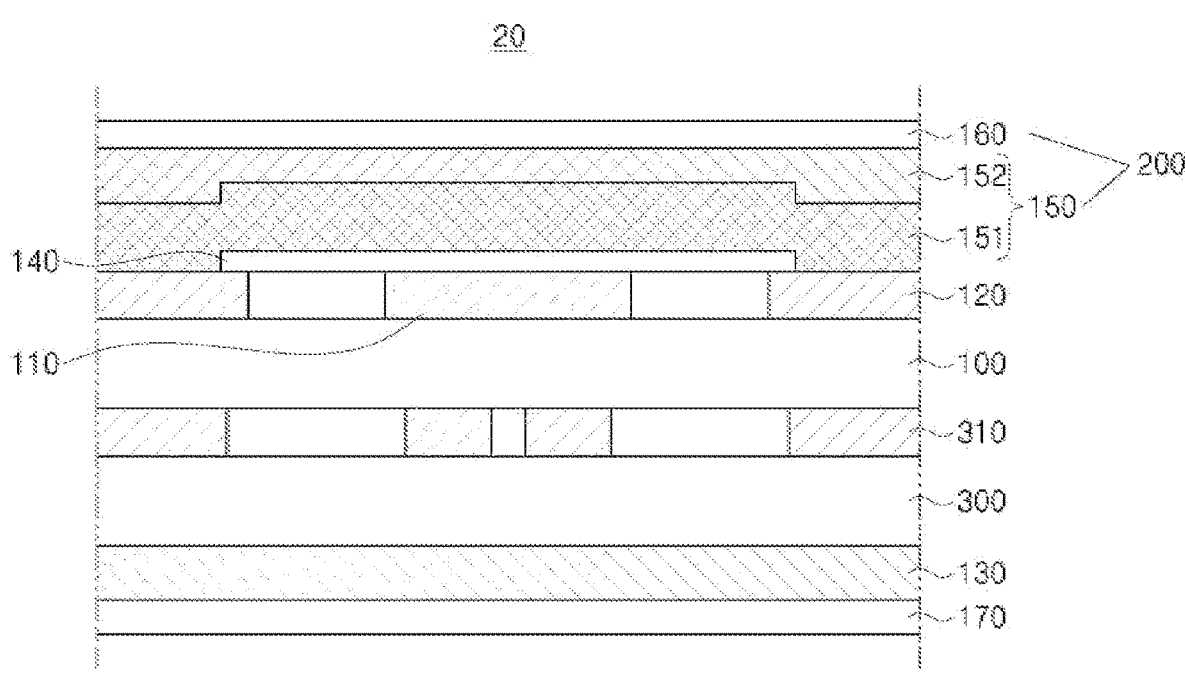

【FIG. 5】
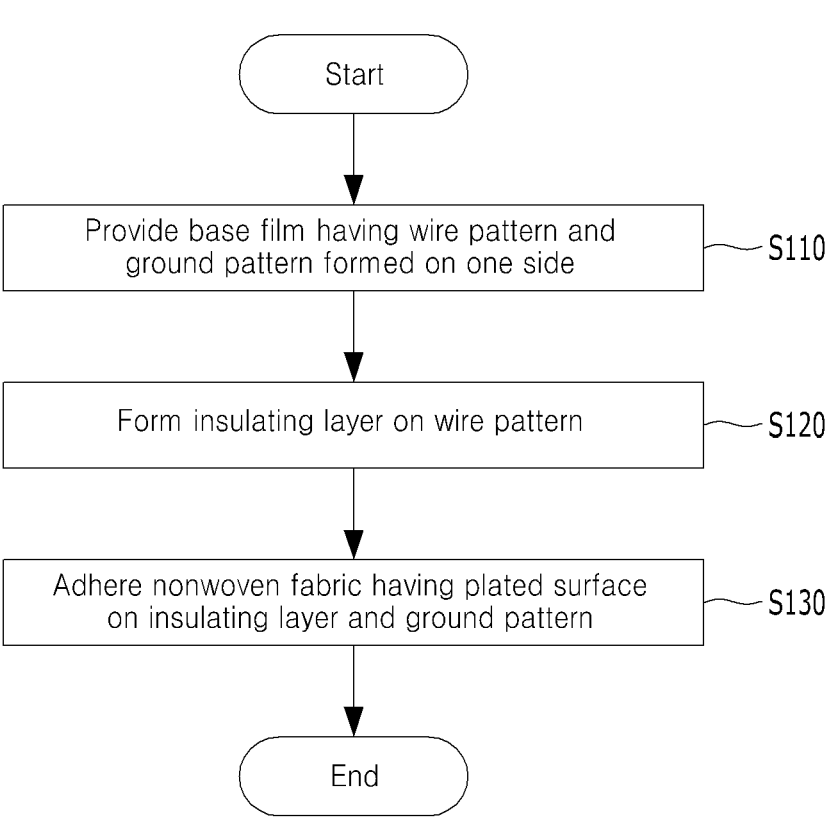

【FIG. 6】
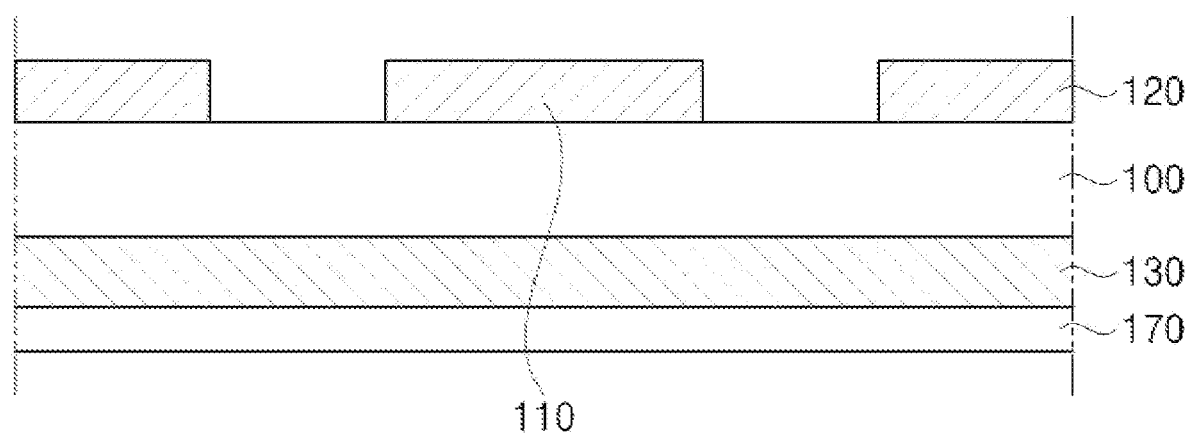

【FIG. 7】
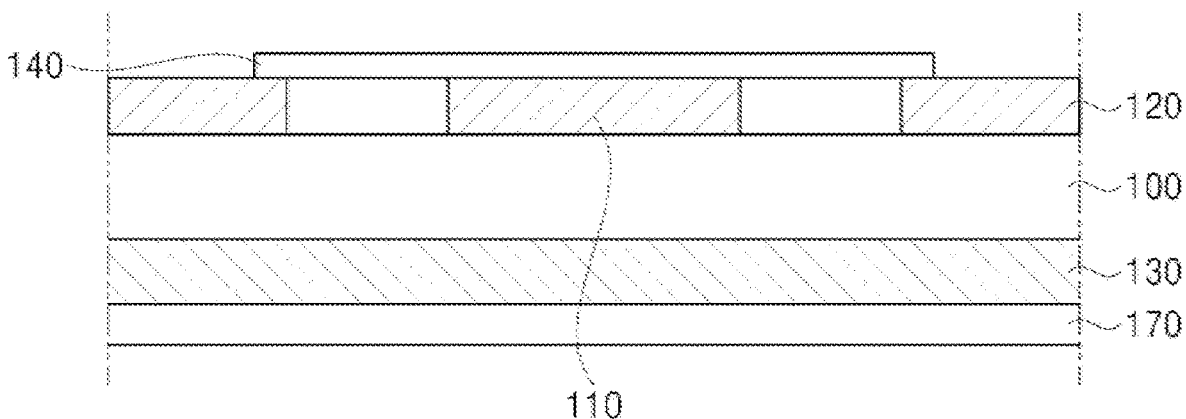

【FIG. 8】
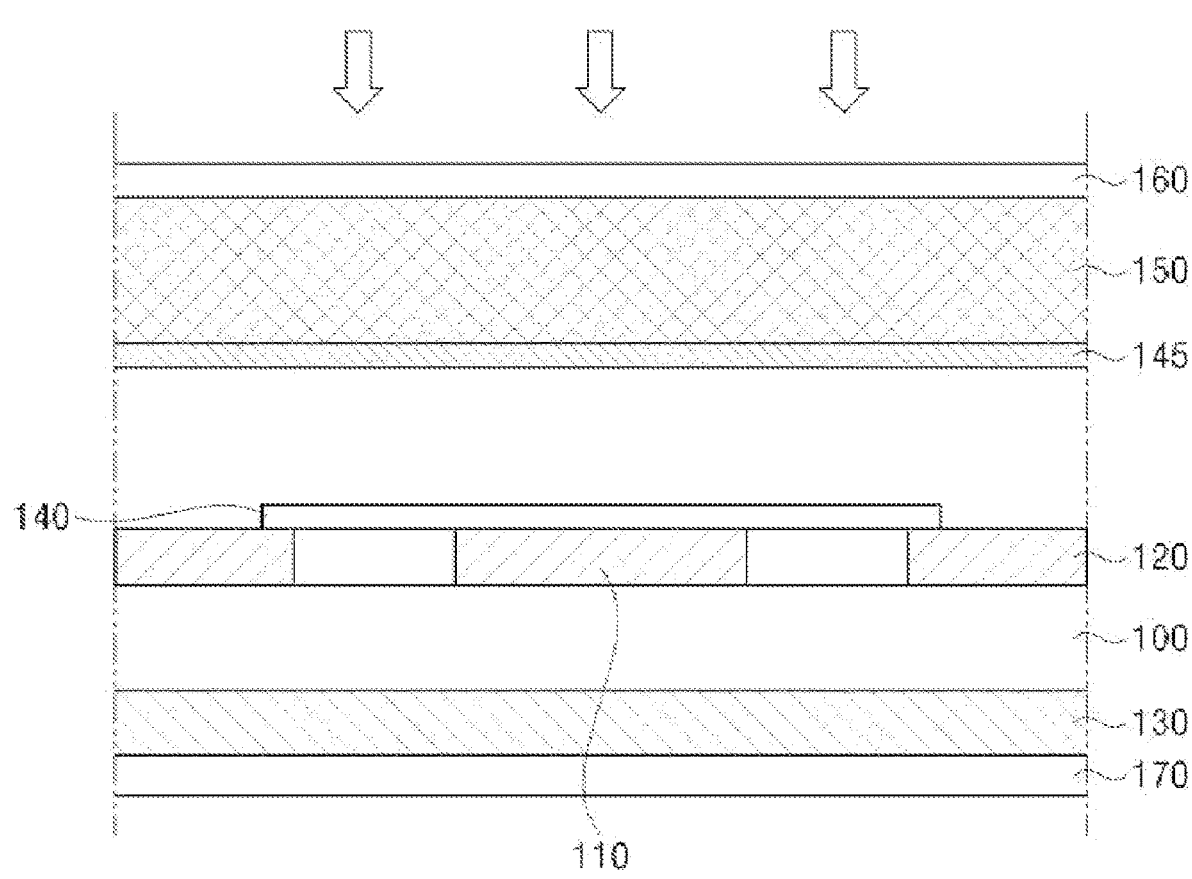

【FIG. 9】
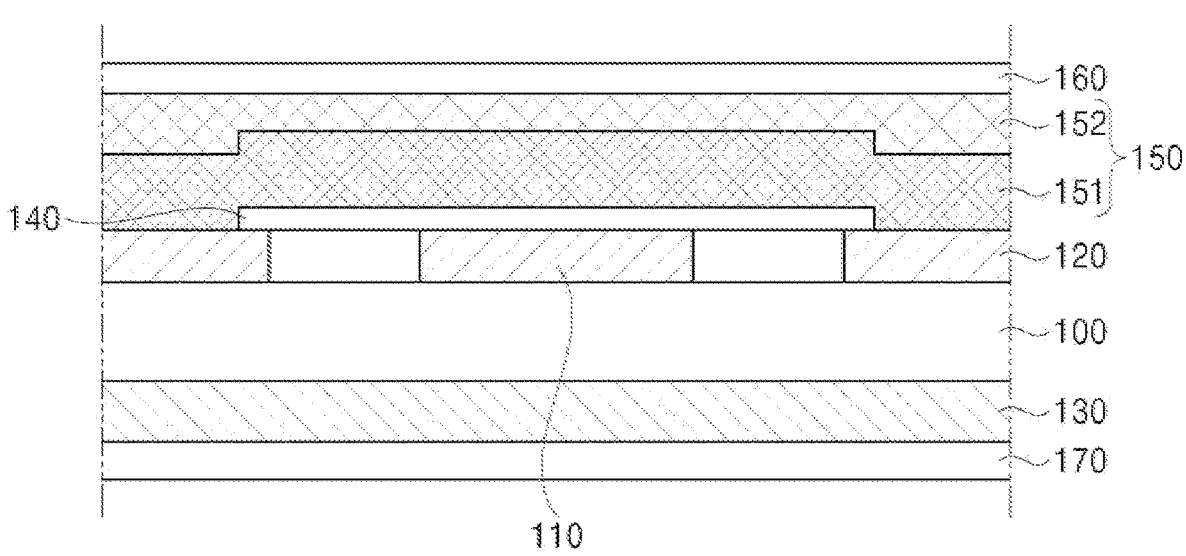

【FIG. 10】
2
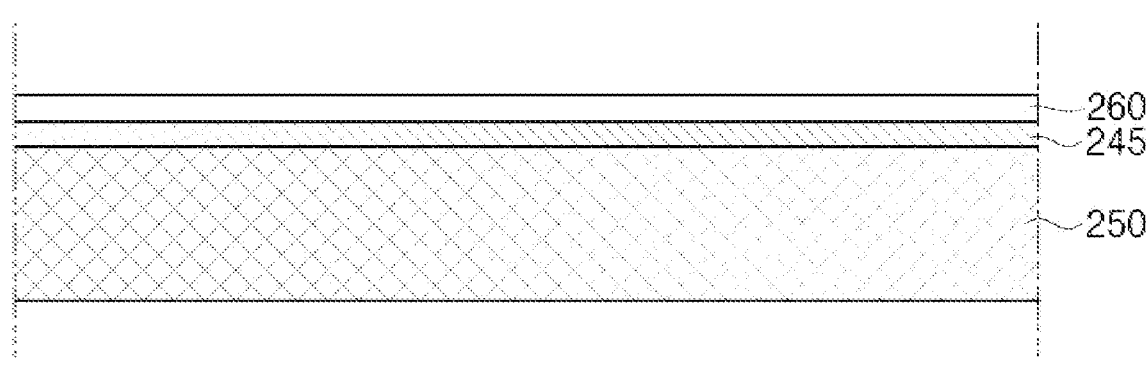

【FIG. 11】
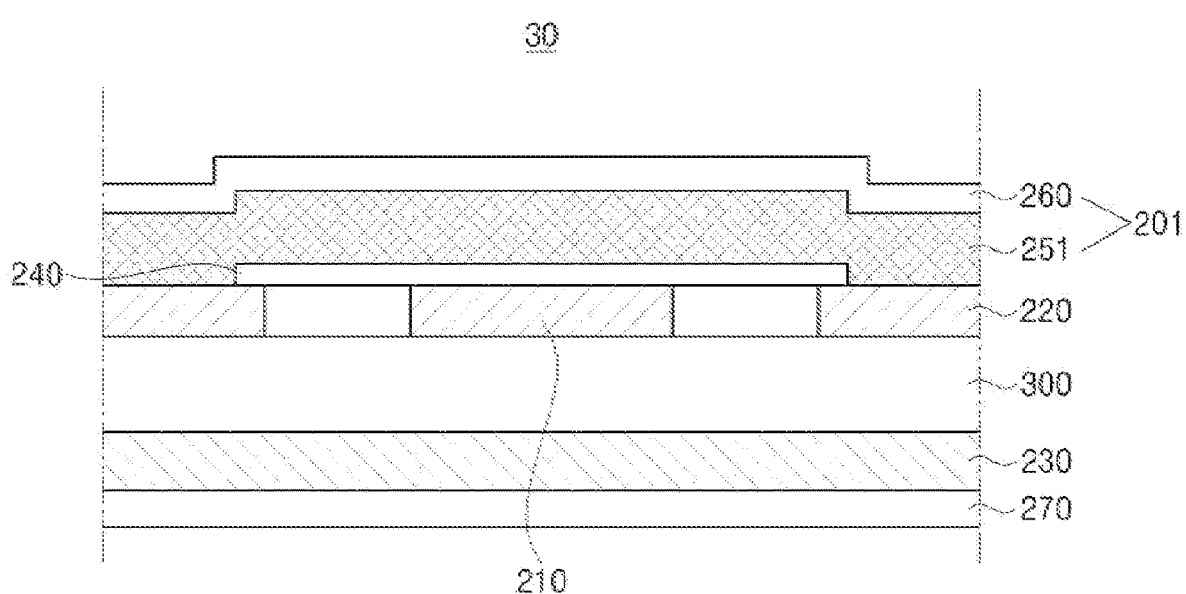

ELECTROMAGNETIC WAVE SHIELDING SHEET, FLEXIBLE PRINTED CIRCUIT BOARD ATTACHED WITH ELECTROMAGNETIC WAVE SHIELDING SHEET, AND MANUFACTURING METHOD THEREOF

BACKGROUND OF THE INVENTION

Field of the Invention

The present invention relates to an electromagnetic wave shielding sheet, a flexible printed circuit board attached with the electromagnetic wave shielding sheet, and a manufacturing method thereof, and more particularly, to an electromagnetic wave shielding sheet using a plated nonwoven fabric, a flexible printed circuit board having improved electromagnetic wave shielding performance and simplified manufacturing process by attaching the plated nonwoven fabric, and a manufacturing method thereof.

Background of the Related Art

An electromagnetic wave is a composite wave of electric and magnetic fields, which is a form of energy generated by using electricity. Although the electric field may be shielded by all conductive objects, the magnetic field has a strong transmitting property and passes through all objects, and particularly, the magnetic field is known to have harmful effects on the human body.

The electromagnetic wave like this is emitted from electric devices and power lines, such as home appliances, wireless communication systems, control systems, power systems, high-frequency devices, lighting devices, and the like used around us, and it is shown that when a human body is exposed to the electromagnetic waves for a long time, it is highly likely to develop a disease as the body temperature changes and biorhythm is broken.

As electronic devices using high-frequency bands are developed recently, demands for efficient shielding means also increase, and thus flexible printed circuit boards attached with an electromagnetic wave shielding sheet including a plated nonwoven fabric are introduced. The plated nonwoven fabric used in the electromagnetic wave shielding should be grounded to exhibit efficient electromagnetic wave blocking ability. Therefore, a relatively simple structure and manufacturing process of a flexible printed circuit board capable of maintaining ground of the plated nonwoven fabric is required.

SUMMARY OF THE INVENTION

Therefore, the present invention has been made in view of the above problems, and it is an object of the present invention to provide an electromagnetic wave shielding sheet using a plated nonwoven fabric to have improved electromagnetic wave shielding efficiency.

Another object of the present invention is to provide a flexible printed circuit board attached with an electromagnetic wave shielding sheet, and a manufacturing method thereof, in which a plated nonwoven fabric is used to maintain ground, and a simplified structure and manufacturing process is applied.

The objects of the present invention are not limited to the objects mentioned above, and unmentioned other objects will be clearly understood by those skilled in the art from the following descriptions.

An electromagnetic wave shielding sheet according to some embodiments of the present invention for accomplishing the objects includes a nonwoven fabric having a plated surface, and an adhesive layer formed on one side of the nonwoven fabric.

In some embodiments of the present invention, the electromagnetic wave shielding sheet may further include an insulating layer and a protective layer sequentially formed on the other side of the nonwoven fabric, and a liner layer covering one side of the adhesive layer facing the nonwoven fabric.

An electromagnetic wave shielding sheet according to some other embodiments of the present invention for accomplishing the objects includes a nonwoven fabric having a plated surface, and the nonwoven fabric includes a nonwoven fabric layer having an adhesive layer adsorbed therein.

In some embodiments of the present invention, the nonwoven fabric may further include a general nonwoven fabric layer including only plated fiber tissues on the nonwoven fabric layer having the adhesive layer adsorbed therein.

In some embodiments of the present invention, the electromagnetic wave shielding sheet may further include a first insulating layer formed on the nonwoven fabric.

A flexible printed circuit board attached with an electromagnetic wave shielding sheet according to some embodiments of the present invention for accomplishing the objects may be configured as any one of the electromagnetic wave shielding sheets described above is attached.

In some embodiments of the present invention, the flexible printed circuit board may include: a base film having a wiring pattern and a ground pattern formed on one side; and a second insulating layer covering the wiring pattern.

In some embodiments of the present invention, the nonwoven fabric may be directly in contact with the ground pattern.

In some embodiments of the present invention, the flexible printed circuit board may further include: a ground layer formed on the other side of the base film; and a third insulating layer covering the ground layer.

A method of manufacturing a flexible printed circuit board attached with an electromagnetic wave shielding sheet according to some embodiments of the present invention for accomplishing the objects includes the steps of: providing a base film having a wiring pattern and a grounding pattern formed on one side; forming a first insulating layer on the wiring pattern; and attaching a nonwoven fabric having a plated surface on the first insulating layer and the ground pattern, wherein the step of attaching a nonwoven fabric having a plated surface on the ground pattern includes the steps of: disposing the nonwoven fabric attached with an adhesive layer on the ground pattern; and attaching the nonwoven fabric on the ground pattern by compressing in a hot press method.

Details of the other embodiments are included in the detailed description and drawings.

BRIEF DESCRIPTION OF THE DRAWINGS

FIG. 1 is a cross-sectional view showing an electromagnetic wave shielding sheet according to some embodiments of the present invention.

FIG. 2 is a cross-sectional view showing a flexible printed circuit board attached with an electromagnetic wave shielding sheet according to some embodiments of the present invention.

FIG. 3 is a view for describing the function of a flexible printed circuit board attached with an electromagnetic wave shielding sheet according to some embodiments of the present invention.

FIG. 4 is a cross-sectional view showing a flexible printed circuit board attached with an electromagnetic wave shielding sheet according to some other embodiments of the present invention.

FIG. 5 is a flowchart illustrating a method of manufacturing a flexible printed circuit board attached with an electromagnetic wave shielding sheet according to some embodiments of the present invention.

FIGS. 6 to 9 are views showing intermediate processes of a method of manufacturing a flexible printed circuit board attached with an electromagnetic wave shielding sheet according to some embodiments of the present invention.

FIG. 10 is a cross-sectional view showing an electromagnetic wave shielding sheet according to another embodiment of the present invention.

FIG. 11 is a cross-sectional view showing a flexible printed circuit board attached with an electromagnetic wave shielding sheet according to another embodiment of the present invention.

DETAILED DESCRIPTION OF THE PREFERRED EMBODIMENT

The advantages and features of the present invention and the methods for achieving them will become clear with reference to the embodiments described below in detail, together with the accompanying drawings. However, the present invention is not limited to the embodiments disclosed below, but will be implemented in a variety of different forms, and these embodiments only make the disclosure of the present invention complete, and are provided to fully inform those skilled in the art of the scope of the present invention, and the present invention is only defined by the scope of the claims. The sizes and relative sizes of the components shown in the drawings may be exaggerated for clarity of explanation. Like reference numerals designate like elements throughout the specification, and "and/or" includes each of the mentioned items and one or more combinations.

When an element or a layer is referred to as being "on" or "above" another element or layer, it includes a case of interposing other layers or other elements therebetween, as well as a case of immediately above another element or layer. On the contrary, when an element is referred to as being "directly on" or "directly above", it indicates that another element or layer is not interposing therebetween.

Spatially relative terms "below", "beneath", "lower", "above", "upper", and the like may be used to easily describe correlations between one element or component and other elements or components as shown in the drawings. The spatially relative terms should be understood as terms including directions of elements different from each other when the elements are in use or operate, in addition to the directions shown in the drawings. For example, when turning over the elements shown in the drawings, an element described as "below" or "beneath" another element may be placed "above" another element. Accordingly, the exemplary term "below" may include directions of both below and above. The elements may also be oriented in other directions, and thus the spatially relative terms may be interpreted according to the orientations.

The terms used in this specification are for describing the embodiments and are not intended to limit the present invention. In this specification, singular forms also include plural forms unless specifically stated otherwise in a phrase. The terms "comprises" and/or "comprising" used in this specification do not exclude the presence or addition of one or more elements in addition to the mentioned elements.

Although first, second, and the like are used to describe various elements or components, it goes without saying that these elements or components are not limited by these terms. These terms are used only to distinguish one element or component from the other elements or components. Accordingly, it goes without saying that a first element or component mentioned below may also be a second element or component within the technical spirit of the present invention.

Unless otherwise defined, all the terms (including technical and scientific terms) used in this specification may be used in a meaning commonly understood by those skilled in the art. In addition, the terms defined in commonly used dictionaries are not interpreted ideally or excessively unless explicitly and specially defined.

FIG. 1 is a cross-sectional view showing an electromagnetic wave shielding sheet according to some embodiments of the present invention.

Referring to FIG. 1, an electromagnetic wave shielding sheet 1 according to some embodiments of the present invention may include a nonwoven fabric 150 having a plated surface, an adhesive layer 145 formed on one side of the nonwoven fabric 150, and an insulating layer 160 formed on the other side of the nonwoven fabric 150.

The nonwoven fabric 150 may have, for example, a plating layer formed on the surface of and/or inside the fabric tissues formed by disorderly overlapping the materials such as liquid crystal polymer (LCP) or polyethylene terephthalate (PET). Although the plating layer may include, for example, at least one metal among copper, nickel, gold, palladium, tin, and aluminum, or an alloy thereof, the present invention is not limited thereto. The plating layer may be formed on the fabric tissues of the nonwoven fabric 150 at a thickness of, for example, 1 μm or less.

As the nonwoven fabric 150 includes irregular fabric tissues of which the surface is plated, the effect of internal absorption and diffused reflection of electromagnetic waves may increase. The shielding effect obtained by the plated nonwoven fabric 150 may be improved owing to the effect of the internal absorption and diffuses reflection. A more detailed description of the shielding effect will be described below.

The adhesive layer 145 formed on one side of the nonwoven fabric 150 adheres the flexible printed circuit board and the nonwoven fabric 150 when the electromagnetic wave shielding sheet 1 is attached on the flexible printed circuit board, for example, in a hot press method, and may be melted by heat and adsorbed into the tissues of the nonwoven fabric 150.

A first insulating layer 160 formed on the other side of the nonwoven fabric 150 may include an insulating material, for example, such as a coverlay film, a solder resist, or the like. The first insulating layer 160 may protect the nonwoven fabric 150 by covering the other side of the nonwoven fabric 150.

Although not shown, a protective layer such as a PET film may be further formed on the first insulating layer 160, and a liner layer may be further formed to cover the one side of the adhesive layer 145 facing the nonwoven fabric 150, that is, one side of the exposed adhesive layer 145. However, the protective layer and the liner layer may be removed in the process of attaching the electromagnetic wave shielding sheet to the flexible printed circuit board described below.

FIG. 2 is a cross-sectional view showing a flexible printed circuit board attached with an electromagnetic wave shielding sheet according to some embodiments of the present invention, and FIG. 3 is a view for describing the function of a flexible printed circuit board attached with an electromagnetic wave shielding sheet according to some embodiments of the present invention.

Referring to FIGS. 2 and 3, a flexible printed circuit board 10 attached with an electromagnetic wave shielding sheet 200 according to some embodiments of the present invention is shown. That is, the electromagnetic shielding sheet 1 described with reference to FIG. 1 is attached.

Specifically, the flexible printed circuit board 10 may include a base film 100 having a wiring pattern 110 and a ground pattern 120 formed on one side, a second insulating layer 140 covering the wiring pattern 110, and a ground layer 130 and a third insulating layer 170 sequentially stacked on the other side of the base film 100, and the electromagnetic wave shielding sheet 200 may be attached on the second insulating layer 140 and the ground pattern 120.

Meanwhile, the electromagnetic wave shielding sheet 200 may include a nonwoven fabric 150 having a plated surface and attached to the second insulating layer 140 and the ground pattern 120 by an adhesive layer, and a first insulating layer 160 covering the nonwoven fabric 150. Meanwhile, the adhesive layer 145 of FIG. 1 may be melted and adsorbed into the fiber tissues of the nonwoven fabric 150 in the attachment process using heat.

The base film 100 may be formed of a flexible material, and may be included as a substrate of the flexible printed circuit board according to an embodiment of the present invention so that the flexible printed circuit board may be bent or folded.

Although the base film 100 may include, for example, a polyimide film, a PET film, a polyethylene naphthalate film, or the like, the present invention is not limited thereto.

The wiring pattern 110 may be formed on one side of the base film 100. The wiring pattern 110 may connect signals between the elements mounted on the surface of the base film 100 and circuit components. In addition, the wiring pattern 110 may function as a reinforcement pattern, a dummy pattern, a redistribution pattern, or the like on the base film 100.

The ground pattern 120 may be formed on the base film 100, in addition to the wiring pattern 110. The ground pattern 120 may provide a ground potential on the base film 100.

Although the wiring pattern 110 and the ground pattern 120 may include, for example, a conductive material such as copper, the present invention is not limited thereto. Specifically, the wiring pattern 110 and the ground pattern 120 may be formed of an electrically conductive material such as gold, aluminum, or the like.

At least a portion of the ground pattern 120 may be connected to the ground layer 130 through a via (not shown) formed to pass through the base film 100.

The second insulating layer 140 may be formed to cover the wiring pattern 110. The second insulating layer 140 may include a flexible insulator material, and may include a coverlay film, a solder resist, or the like.

The electromagnetic wave shielding sheet 200 may be attached on the ground pattern 120 and the second insulating layer 140 using an adhesive layer.

As described below, the nonwoven fabric 150 adhered on the ground pattern 120 and the second insulating layer 140 using a hot press method may include a nonwoven fabric layer 151 in which the adhesive layer is melted and adsorbed. As the adhesive layer is completely adsorbed into the nonwoven fabric 150, a slim electromagnetic wave shielding sheet may be obtained without the adhesive layer remaining between the nonwoven fabric 150 and the second insulating layer 140 or between the nonwoven fabric 150 and the ground pattern 120.

On the other hand, in some embodiments, a general nonwoven fabric layer 152 including only plated fiber tissues may remain on the nonwoven fabric layer 151 in which the adhesive layer is melted and adsorbed.

The nonwoven fabric 150 may be directly in contact with at least a portion of the ground pattern 120 to function as an electromagnetic wave shielding layer as a ground potential is applied to the nonwoven fabric 150. In addition, as the nonwoven fabric 150 is adhered on the ground pattern 120 in a hot press method using the adhesive layer as a medium, a separate via for connecting the nonwoven fabric 150 to the ground pattern 120 or the ground layer 130 on the other side of the base film 100 is not required. Accordingly, the process of manufacturing the flexible printed circuit board 10 attached with an electromagnetic wave shielding sheet according to an embodiment of the present invention may be simplified as a process of forming the via is not required after the electromagnetic wave shielding sheet is attached.

As shown in FIG. 2, as the second insulating layer 140 completely covers the wiring pattern 110, the nonwoven fabric 150 and the wiring pattern 110 may not be in contact with and blocked from each other. Accordingly, a short circuit may not occur between the nonwoven fabric 150, where the ground potential is maintained, and the wiring pattern 110.

The nonwoven fabric 150 may have, for example, a plating layer formed on the surface of and/or inside the fabric tissues formed by disorderly overlapping the materials such as liquid crystal polymer (LCP) or polyethylene terephthalate (PET). Although the plating layer may include, for example, at least one metal among copper, nickel, gold, palladium, tin, and aluminum, or an alloy thereof, the present invention is not limited thereto. The plating layer may be formed on the fabric tissues of the nonwoven fabric 150 at a thickness of, for example, 1 μm or less.

As the nonwoven fabric 150 includes irregular fabric tissues of which the surface is plated, the effect of internal absorption and diffused reflection of electromagnetic waves may increase. The shielding effect obtained by the plated nonwoven fabric 150 may be improved owing to the effect of the internal absorption and diffuses reflection. That is, as shown in FIG. 3, electromagnetic waves 180 are generated from the wiring pattern 110 formed on the base film 100 or circuit elements connected thereto, and radiated toward the nonwoven fabric 150.

Although the radiated electromagnetic waves 180 enter the nonwoven fabric 150. The entered electromagnetic waves are reflected once or partially transmitted on the surface in the case of a general metal electromagnetic shielding layer, the nonwoven fabric 150 has a relatively improved shielding and absorption effect obtained by diffusely reflecting the electromagnetic waves entering inside as the nonwoven fabric 150 includes plated fiber tissues. In addition, the amount of metal required for shielding is sufficient or the shielding characteristic is excellent compared to a shielding layer in which a polymer material containing a conventional metal powder is used.

Referring to FIG. 1 again, the first insulating layer 160 may be formed on the nonwoven fabric 150. The first insulating layer 160 may include, for example, an insulating material such as a coverlay film, a solder resist, or the like. The first insulating layer 160 may protect the flexible printed circuit board 10 by surrounding both sides of the flexible printed circuit board 10, together with the third insulating layer 170.

FIG. 4 is a cross-sectional view showing a flexible printed circuit board attached with an electromagnetic wave shielding sheet according to some other embodiments of the present invention.

Referring to FIG. 4, a flexible printed circuit board 20 attached with an electromagnetic wave shielding sheet according to some other embodiments of the present invention may include a multilayer substrate configured of a first base film 100 and a second base film 300.

A first wiring pattern 110 may be formed on one side of the first base film 100, and a second wiring pattern 310 may be formed on the second base film 300. That is, the flexible printed circuit board 20 of the embodiment of FIG. 3 has a structure of sequentially stacking the second base film 300, the second wiring pattern 310, the first base film 100, and the first wiring pattern 110.

Although a two-layer substrate structure configured of the first base film 100 and the second base film 300 is shown in FIG. 2, the flexible printed circuit board 20 according to an embodiment of the present invention does not exclude a multilayer substrate of three or more layers including additional base films and wiring patterns between the first base film 100 and the second base film 300.

As the configuration of the ground layer 130 and the third insulating layer 170 covering the other side of the second base film 300 have the same structure as the flexible printed circuit board 1 described above with reference to FIG. 1, a description related thereto will be omitted.

FIG. 5 is a flowchart illustrating a method of manufacturing a flexible printed circuit board attached with an electromagnetic wave shielding sheet according to some embodiments of the present invention.

Referring to FIG. 5, a method of manufacturing a flexible printed circuit board attached with an electromagnetic wave shielding sheet according to some embodiments of the present invention includes the steps of providing a base film having a wiring pattern and a grounding pattern formed on one side (S110), forming an insulating layer on the wiring pattern (S120), and adhering a nonwoven fabric having a plated surface on the insulating layer and the ground pattern (S130). The above steps will be described in more detail with reference to FIGS. 6 to 9.

FIGS. 6 to 9 are views showing intermediate processes of a method of manufacturing a flexible printed circuit board attached with an electromagnetic wave shielding sheet according to some embodiments of the present invention.

First, referring to FIG. 6, a base film 100 having a wiring pattern 110 and a ground pattern 120 formed on one side is provided.

The base film 100 may include, for example, a flexible material such as a polyimide film, a PET film, a polyethylene naphthalate film, or the like, and the wiring pattern 110 and the ground pattern 120 may include an electrically conductive material such as gold, aluminum, or the like and may be formed on one side of the base film 100.

In some embodiments of the present invention, a ground layer 130 and an insulating layer 170 covering the ground layer 130 may be formed on the other side of the base film 100.

Next, referring to FIG. 7, a second insulating layer 140 may be formed on the wiring pattern 110. The second insulating layer 140 may completely cover the top surface of the wiring pattern 110 and expose at least a portion of the ground pattern 120.

The second insulating layer 140 may include a flexible insulator material, and may include a coverlay film, a solder resist, or the like.

Referring to FIG. 8, an electromagnetic wave shielding sheet configured of an adhesive layer 145, a plated nonwoven fabric 150, and a first insulating layer 160 is prepared to be adhered on the second insulating layer 140 and the ground pattern 120.

The nonwoven fabric 150 may be formed, as at least one metal among copper, nickel, gold, palladium, tin, and aluminum, or an alloy thereof is formed as a plating layer on the surface of fiber tissues of an insulator constituting the nonwoven fabric 150. Plating the nonwoven fabric 150 may include, for example, performing electroless plating on the nonwoven fabric 150 with a plating solution containing a reducing agent.

Referring to FIG. 9, the nonwoven fabric 150 attached with the adhesive layer 145 is aligned at the attachment position on the base film 100, and the second insulating layer 140 and the nonwoven fabric 150 are adhered on the second insulating layer 140 and the ground pattern 120 using heat. The nonwoven fabric 150 may be adhered on the second insulating layer 140 and the ground pattern 120 by being compressed, for example, in a hot press method.

In some embodiments of the present invention, the second insulating layer 140 and the nonwoven fabric 150 may be adhered on the wiring pattern 110 and the ground pattern 120 through the same hot press process. That is, unlike the embodiment described above with reference to FIGS. 6 to 9, in which the second insulating layer 140 is formed on the wiring pattern 110 first, and then the nonwoven fabric 150 is adhered to cover the second insulating layer 140 and the ground pattern 120, a film constituting the second insulating layer 140 and the nonwoven fabric 150 are sequentially aligned on the base film 100 on which the wiring pattern 110 and the ground pattern 120 are formed, and the second insulating layer 140 and the nonwoven fabric 150 may be simultaneously attached using a one-time hot press method.

At this point, as the second insulating layer 140 and the nonwoven fabric 150 are compressed in a hot press method, air bubbles are discharged through the nonwoven fabric 150, so that the possibility of generating a defect in the appearance may also be lowered in the element mounting process that can be additionally performed on the flexible printed circuit board 10.

FIG. 10 is a cross-sectional view showing an electromagnetic wave shielding sheet according to another embodiment of the present invention. Hereinafter, description of parts the same as those of the previous embodiment will be omitted, and it will be described mainly focusing on the differences.

Referring to FIG. 10, an electromagnetic wave shielding sheet 2 according to another embodiment of the present invention may include a nonwoven fabric 250 having a plated surface, an adhesive layer 245 formed on one side of the nonwoven fabric 250, and an insulating layer 260 formed on the other side of the nonwoven fabric 250. Although not shown in the drawing, a protective layer may be included, in addition to the insulating layer 260. That is, at least one among the insulating layer 260 and the protective layer may be formed on the other side of the nonwoven fabric 250.

The electromagnetic wave shielding sheet 2 described using the embodiment of FIG. 10 is different from the embodiment of FIG. 1 or the like in that the adhesive layer 245 and the insulating layer 260 are sequentially formed on one side of the nonwoven fabric 250, rather than the adhesive layer 245 and the insulating layer 260 are formed on one side and the other side of the nonwoven fabric 250, respectively.

The adhesive layer 245 may not contain conductive particles unlike the previous embodiments. The adhesive layer 245 may bond the nonwoven fabric 250 having a plated surface and the insulating layer 260, and may be adsorbed into the nonwoven fabric 250 having a plated surface when the electromagnetic wave shielding sheet 2 is attached on the flexible printed circuit board in a hot press method. More specifically, as the adhesive layer 245 is completely adsorbed into the nonwoven fabric 250 in the hot press process, the electromagnetic wave shielding sheet 2 and the flexible printed circuit board may be in contact with and electrically connected to each other. This may reduce the overall thickness of the flexible printed circuit board attached with an electromagnetic wave shielding sheet.

Although not shown in FIG. 10, a PET film and/or a liner layer may be further formed on the insulating layer 260. However, the protective layer and the liner layer may be removed in the process of attaching the electromagnetic wave shielding sheet to the flexible printed circuit board described below.

FIG. 11 is a cross-sectional view showing a flexible printed circuit board attached with an electromagnetic wave shielding sheet according to another embodiment of the present invention.

Referring to FIG. 11, the flexible printed circuit board 30 includes a base film 300 having a wiring pattern 210 and a ground pattern 220 formed on one side, a second insulating layer 240 covering the wiring pattern 210, and a ground layer 230 and a third insulating layer 270 sequentially stacked on the other side of the base film 300, and an electromagnetic wave shielding sheet 201 is formed on the second insulating layer 240 and the ground pattern 220.

Meanwhile, the electromagnetic wave shielding sheet 201 may include a nonwoven fabric 251 having a plated surface attached on the second insulating layer 240 and the ground pattern 220 by an adhesive layer, and a first insulating layer 260 covering the nonwoven fabric 251. Meanwhile, as an adhesive layer 245 that does not contain the conductive particles of FIG. 10 is completely melted and adsorbed into the fiber tissues of the nonwoven fabric 250 in the attachment process using heat, the electromagnetic wave shielding sheet 201 may be attached to the second insulating layer 240 or the ground pattern 220.

As shown in the description of FIG. 10, as the adhesive layer 245 is completely or mostly melted and adsorbed into the fiber tissues of the nonwoven fabric 250 in the attachment process using heat, the thickness of the electromagnetic wave shielding sheet 201 and the overall thickness of the flexible printed circuit board 30 attached with the electromagnetic wave shielding sheet 201 may be relatively reduced.

The electromagnetic wave shielding sheet and the flexible printed circuit board attached with the electromagnetic wave shielding sheet according to an embodiment of the present invention may obtain an excellent effect of diffused-reflecting and absorbing incident electromagnetic waves owing to the fiber tissues of the plated nonwoven fabric included in the electromagnetic wave shielding sheet.

In addition, as the nonwoven fabric is directly adhered on the ground pattern in a hot press method using the adhesive layer as a medium, a separate via for connecting the nonwoven fabric to the ground pattern or the ground layer on the other side of the base film is not required. Accordingly, the process of manufacturing the flexible printed circuit board attached with an electromagnetic wave shielding sheet according to an embodiment of the present invention may be simplified as a process of forming the via is not required after the nonwoven fabric is attached.

The effects of the present invention are not limited to the effects mentioned above, and unmentioned other effects will be clearly understood by those skilled in the art from the description of the claims.

Although the embodiments of the present invention have been described with reference to the accompanying drawings, those skilled in the art may understand that the present invention can be implemented in other specific forms without changing the technical spirit or essential features. Therefore, the embodiments described above should be understood as illustrative in all respects and not restrictive.

DESCRIPTION OF SYMBOLS

100, 200, 300: Base film
110, 210: Wiring pattern
120, 220: Ground pattern
130, 230: Ground layer
140, 240: Second insulating layer
150, 250: Nonwoven fabric
160, 260: First insulating layer
170, 270: Third insulating layer

What is claimed is:

1. An electromagnetic wave shielding sheet comprising:
a nonwoven fabric having a plated surface;
an adhesive layer formed on one side of the nonwoven fabric not to contain conductive particles; and
at least one among an insulating layer and a protective layer sequentially formed on the adhesive layer, wherein when hot press is applied, the adhesive layer is absorbed into the nonwoven fabric, allowing the non-woven fabric and a flexible printed circuit to be in contact with each other to be electrically conducted.

2. The electromagnetic wave shielding sheet according to claim 1, wherein the plating layer includes at least one metal among copper, nickel, gold, palladium, tin, and aluminum, or an alloy thereof, and has a thickness of 1 μm or less.

* * * * *